US010224822B2

(12) United States Patent
Miller et al.

(10) Patent No.: US 10,224,822 B2
(45) Date of Patent: Mar. 5, 2019

(54) NANOSECOND PULSER

(71) Applicant: EAGLE HARBOR TECHNOLOGIES, INC., Seattle, WA (US)

(72) Inventors: Kenneth E. Miller, Seattle, WA (US); Timothy Ziemba, Bainbridge Island, WA (US); Ilia Slobodov, Seattle, WA (US); John G. Carscadden, Seattle, WA (US); James Prager, Seattle, WA (US)

(73) Assignee: EAGLE HARBOR TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 15/623,464

(22) Filed: Jun. 15, 2017

(65) Prior Publication Data
US 2017/0294842 A1 Oct. 12, 2017

Related U.S. Application Data

(63) Continuation of application No. 14/635,991, filed on Mar. 2, 2015, now Pat. No. 9,706,630.
(Continued)

(51) Int. Cl.
H05G 1/22 (2006.01)
H02M 3/335 (2006.01)
(Continued)

(52) U.S. Cl.
CPC ......... H02M 3/33523 (2013.01); H02M 1/08 (2013.01); H02M 7/5387 (2013.01);
(Continued)

(58) Field of Classification Search
CPC .......... H02M 3/33569; H02M 3/3376; H02M 3/33507; H02M 7/53871; H05G 1/10; H05G 1/20
(Continued)

(56) References Cited

U.S. PATENT DOCUMENTS 5,313,481 A 5/1994 Cook et al.
5,321,597 A 6/1994 Alacoque
(Continued)

FOREIGN PATENT DOCUMENTS

EP 1515430 3/2005

OTHER PUBLICATIONS

Bland, M., et al., "A High Power RF Power Supply for High Energy Physics Applications," Proceedings of the Particle Accelerator Conference, Knoxville, TN, May 16-20, 2005, pp. 4018-4020.
(Continued)

Primary Examiner — Nguyen Tran
(74) Attorney, Agent, or Firm — Sanders IP Law

(57) ABSTRACT

A pulse generator is disclosed that includes at least the following stages a driver stage, a transformer stage, a rectifier stage, and an output stage. The driver stage may include at least one solid state switch such as, for example, of one or more IGBTs and/or one or more MOSFETs. The driver stage may also have a stray inductance less than 1,000 nH. The transformer stage may be coupled with the driver stage and/or with a balance stage and may include one or more transformers. The rectifier stage may be coupled with the transformer stage and may have a stray inductance less than 1,000 nH. The output stage may be coupled with the rectifier stage. The output stage may output a signal pulse with a voltage greater than 2 kilovolts and a frequency greater than 5 kHz. In some embodiments, the output stage may be galvanically isolated from a reference potential.

20 Claims, 15 Drawing Sheets

Related U.S. Application Data

(60) Provisional application No. 61/946,457, filed on Feb. 28, 2014.

(51) Int. Cl.
*H02M 7/5387* (2007.01)
*H05G 1/20* (2006.01)
*H02M 1/08* (2006.01)
*H03H 7/01* (2006.01)
*H03K 3/57* (2006.01)

(52) U.S. Cl.
CPC .............. *H03H 7/01* (2013.01); *H05G 1/20* (2013.01); *H03K 3/57* (2013.01)

(58) Field of Classification Search
USPC .................. 363/16–17, 95, 98; 378/104–106
See application file for complete search history.

(56) References Cited

U.S. PATENT DOCUMENTS

| | | | |
|---|---|---|---|
| 5,392,043 A | 2/1995 | Ribner | |
| 5,808,504 A | 9/1998 | Chikai et al. | |
| 5,930,125 A * | 7/1999 | Hitchcock | H03K 3/57 363/26 |
| 6,359,542 B1 | 3/2002 | Widmayer et al. | |
| 6,577,135 B1 | 6/2003 | Matthews et al. | |
| 6,741,120 B1 | 5/2004 | Tan | |
| 6,831,377 B2 | 12/2004 | Yampolsky | |
| 6,897,574 B2 | 5/2005 | Vaysse | |
| 7,061,230 B2 | 6/2006 | Kleine | |
| 7,180,082 B1 | 2/2007 | Hassanein | |
| 7,307,375 B2 | 12/2007 | Smith et al. | |
| 7,319,579 B2 | 1/2008 | Inoue et al. | |
| 7,492,138 B2 | 2/2009 | Zhanh et al. | |
| 7,605,385 B2 | 10/2009 | Bauer | |
| 7,901,930 B2 | 3/2011 | Kuthi et al. | |
| 7,948,185 B2 | 5/2011 | Smith et al. | |
| 8,093,979 B2 | 1/2012 | Wilson | |
| 8,115,343 B2 | 2/2012 | Sanders et al. | |
| 8,143,790 B2 | 3/2012 | Smith et al. | |
| 8,723,591 B2 | 5/2014 | Lee | |
| 8,773,184 B1 | 7/2014 | Petrov | |
| 8,963,377 B2 | 2/2015 | Ziemba et al. | |
| 9,329,256 B2 | 5/2016 | Murad | |
| 2001/0008552 A1 | 7/2001 | Harada | |
| 2003/0169107 A1 | 9/2003 | LeChevalier | |
| 2006/0210020 A1 | 9/2006 | Takahashi | |
| 2006/0274887 A1 | 12/2006 | Sakamoto | |
| 2007/0018504 A1 | 1/2007 | Wiener et al. | |
| 2007/0115705 A1 | 5/2007 | Gotzenberger | |
| 2008/0062733 A1 | 3/2008 | Gay | |
| 2008/0143260 A1 | 6/2008 | Tuymer | |
| 2008/0198634 A1 | 8/2008 | Scheel | |
| 2010/0007358 A1 | 1/2010 | Schaerrer | |
| 2010/0284208 A1 | 11/2010 | Nguyen | |
| 2012/0155613 A1 | 6/2012 | Caiafa | |
| 2013/0113650 A1 | 5/2013 | Behbahani et al. | |
| 2014/0109886 A1 | 4/2014 | Singleton et al. | |
| 2014/0146571 A1 | 5/2014 | Ryoo | |
| 2014/0268968 A1 | 9/2014 | Richardson | |
| 2014/0354343 A1 | 12/2014 | Ziemba et al. | |
| 2015/0028932 A1 | 1/2015 | Ziemba et al. | |
| 2015/0076372 A1 | 3/2015 | Ziemba et al. | |
| 2015/0130525 A1 | 5/2015 | Miller et al. | |
| 2015/0256086 A1 | 9/2015 | Miller et al. | |
| 2015/0303914 A1 | 10/2015 | Ziemba et al. | |
| 2015/0318846 A1 | 11/2015 | Prager et al. | |

OTHER PUBLICATIONS

In, Y., et al., "On the roles of direct feedback and error field correction in stabilizing resistive-wall modes," Nuclear Fusion, 2010, retrieved from p://stacks.iop.org/NF/50/042001 on Apr. 12, 2012, vol. 50, No. 4, 5 pages.

Kim, J., et al., "High Voltage Pulsed Power Supply Using IGBT Stacks," IEEE Transactions on Dielectrics and Electrical Insulation, Aug. 2007, vol. 14, No. 4, 921-926.

Locher, R., "Introduction to Power MOSFETs and their Applications (Application Note 558)," Fairchild Semiconductor, Oct. 1998, 15 pages.

Locher, R., et al., "Use of BiMOSFETs in Modern Radar Transmitters," IEEE International Conference on Power Electronics and Drive Systems, Indonesia, 2001, pp. 776-782.

Reass, W., et al., "Progress Towards a 20 KV, 2 KA Plasma Source Ion Implantation Modulator for Automotive Production of Diamond Film on Aluminum," Submitted to 22nd International Power Symposium, Boca Raton, FL, Jun. 24-27, 1996, 6 pages.

Scoville, J., et al., "The Resistive Wall Mode Feedback Control System on DIII-D," IEEE/NPSS 18th Symposium on Fusion Engineering, Albuquerque, NM, Oct. 25-29, 1999, General Atomics Report GAA23256, Nov. 1999, 7 pages.

Zavadtsev, D., et al., "Compact Electron Linear Accelerator RELUS-5 for Radiation Technology Application," 10th European Particle Accelerator Conference, Edinburgh, UK, Jun. 26-30, 2006, 3 pages.

International Search Report and Written Opinion dated Sep. 15, 2014 as received in PCT Application No. PCT/US2014/04029.

International Search Report and Written Opinion dated Feb. 20, 2015 in related PCT Application No. PCT/US2014/065832 (14 pages).

A. Starikovskiy and N. Aleksandrov, "Plasma-assisted ignition and combustion," Progress in Energy and Combustion Science, 39, Feb. 1, 2013, pp. 61-110.

Gaudet, J., et al, "Research Issues in Developing Compact Pulsed Power for High Peak Power Applications on Mobile Platforms," Proc. IEEE, 92, Jun. 7, 2004, pp. 1144-1165.

D.A. Singleton et al. "Compact Pulsed-Power System for Transient Plasma Ignition," IEEE Trans. Plasma Sci., 37, Aug. 12, 2009 pp. 2275-2279.

Wang, F., "Compact High Repition Rate Pseudospark Pulse Generator," IEEE Trans. Plasma Sci., 33, Aug. 4, 2005 pp. 1177-1181.

Singleton, D. R., "Low Energy Compact Power Modulators for Transient Plasma Ignition," IEEE Trans. Dielectr. Electr. Insul., 18, Aug. 4, 2011, pp. 1084-1090.

Rao, X., et al., "Combustion Dynamics of Plasma-Enhansed Premixed and Nonpremixed Flames," IEEE Trans. Plasma Sci., 38, Nov. 12, 2010 pp. 3265-3271.

Pokryvailo, A., et al, "A 1KW Pulsed Corona System for Pollution Control Applications," 14th IEEE International Pulsed Power Conference, Dallas, TX, USA, Jun. 15-18, 2003.

Pokryvailo, A., et al, "High-Power Pulsed Corona for Treatment of Pollutants in Heterogeneous Media," IEEE Trans. Plasma Sci., 34, Oct. 5, 2006, pp. 1731-1743.

Dammertz, G., et al, "Development of Multimegawatt Gyrotrons for Fusion Plasma Heating and Current Drive," IEEE Trans. Elec. Devices., 52, Apr. 5, 2005, pp. 808-817.

Zhu, Z., et al, "High Voltage pulser with a fast fall-time for plasma immersion ion implantation," Review Sci Inst., 82, 045102, Apr. 2011.

Sanders, J., et al, "Scalable, Compact, Nanosecond Pulse Generation with a High Repetition Rate for Biomedical Applications Requiring Intense Electric Fields," Pulsed Power Conference, 2009, PPC '09, IEEE, Washington, DC, Jun. 28, 2009-Jul. 2, 2009.

Schamiloglu, E., et al, "Scanning the Technology: Modern Pulsed Power: Charlie Martin and Beyond," Proc. IEEE, 92, Jun. 7, 2004, pp. 1014-1020.

Garwin, Richard, "Pulsed Power Peer Review Committee Report," Sandia National Laboratories Report, SAND2000-2515, Oct. 2000.

International Search Report and Written Opinion dated Oct. 6, 2015 in related PCT application No. PCT/US2015/040204 (15 pages).

International Search Report and Written Opinion dated Jul. 14, 2015 in related PCT application No. PCT/US15/18349 (11 pages).

U.S. Office Action in U.S. Appl. No. 14/635,991, dated Jul. 29, 2016, 16 pgs.

(56) References Cited

OTHER PUBLICATIONS

U.S. Office Action in U.S. Appl. No. 14/635,991, dated Jan. 23, 2017, 21 pgs.
U.S. Notice of Allowance in U.S. Appl. No. 14/635,991, dated May 4, 2017, 7 pgs.

* cited by examiner

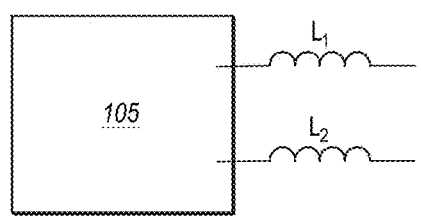
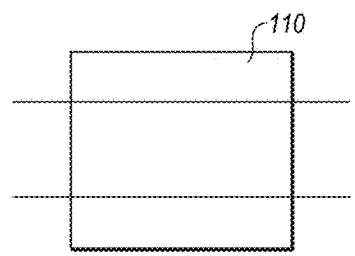
Figure 2A  Figure 2B
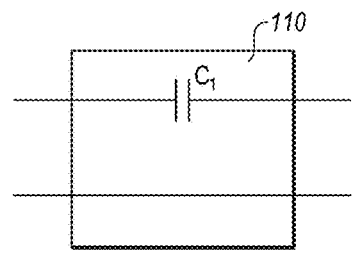
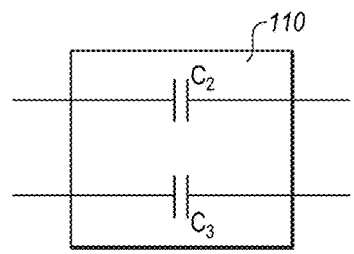
Figure 2C  Figure 2D
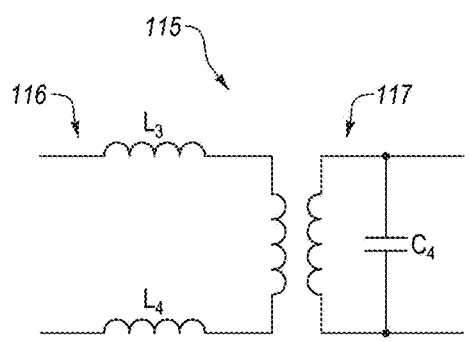
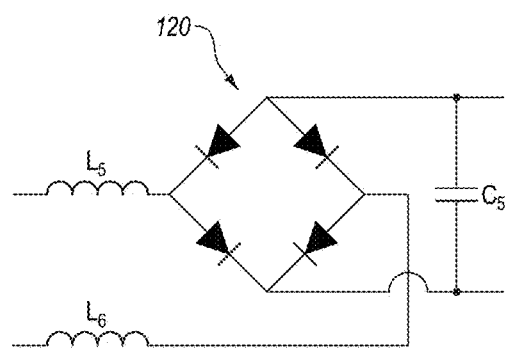
Figure 2E  Figure 2F Time (μs)

NANOSECOND PULSER

SUMMARY

A pulse generator is disclosed that includes one or more of the following stages a driver stage, a transformer stage, a rectifier stage, and an output stage. The driver stage may include at least one of one or more solid state switches such as, for example, an insulated gate bipolar transistor (IGBT) or a metal-oxide-semiconductor field-effect transistor (MOSFET). The driver stage may also have a stray inductance less than 1,000 nH. The transformer stage may be coupled with the driver stage such as, for example, through a balance stage and may include one or more transformers. The rectifier stage may be coupled with the transformer stage and may have a stray inductance less than 1,000 nH. The output stage may be coupled with the rectifier stage. The output stage may output a signal pulse with a voltage greater than 2 kilovolts and a frequency greater than 5 kHz. In some embodiments, the output stage may be galvanically isolated from a reference potential.

A method is also disclosed that includes the following: generating a first input waveform having a first input frequency, a first input voltage, and a first input duration; outputting a first output pulse having a rise time less than 1,000 nanoseconds, a first output voltage greater than the first input voltage, and a pulse width substantially equal to the first input duration; turning off the first input waveform for a second input duration; generating a second input waveform having a second input frequency, a second input voltage, and a second input duration, wherein the second input duration is different than the first input duration; and outputting a second output pulse having a rise time less than 1,000 nanoseconds, a second output voltage greater than the second input voltage, and a pulse width substantially equal to the second input duration.

BRIEF DESCRIPTION OF THE FIGURES

These and other features, aspects, and advantages of the present disclosure are better understood when the following Detailed Description is read with reference to the accompanying drawings.

FIG. 2A is an example driver stage according to some embodiments described in this document.

FIG. 2B is an example balance stage according to some embodiments described in this document.

FIG. 2C is an example balance stage according to some embodiments described in this document.

FIG. 2D is an example balance stage according to some embodiments described in this document.

FIG. 2E is an example transformer stage according to some embodiments described in this document.

FIG. 2F is an example rectifier stage according to some embodiments described in this document.

DETAILED DESCRIPTION

Figure 1:
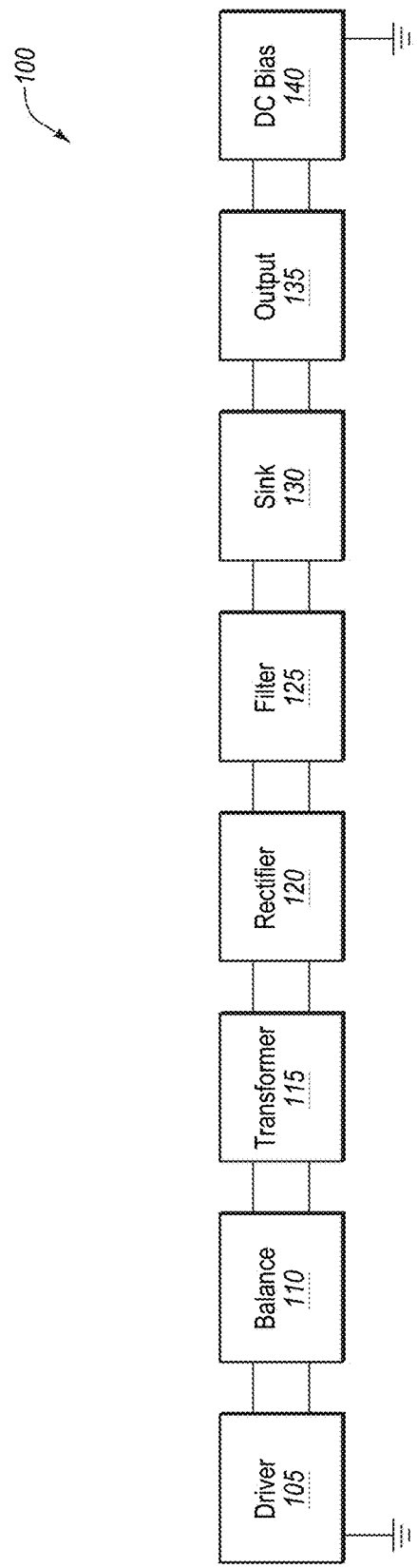
FIG. 1 is an example block diagram of a pulse generator according to some embodiments.

Systems and methods are disclosed to provide high voltage and/or high power output waveforms with programmable control from Direct Current (DC) to greater than 100 kHz pulses with controllable duty cycles from 0 to 100%. In some embodiments, a system can include a pulse generator that is galvanically isolated.

There are number of potential challenges that must be overcome when designing a high voltage pulse generator. For example, slow rise times can be detrimental to a high voltage pulse generator especially when switching at high frequencies. For example, a high frequency pulse generator may not be able to switch quickly enough if the rise time is longer than the pulse period because the pulse may not reach the peak voltage before being switched off again.

As another example, a high voltage pulse generator may also smooth a high frequency input signal to generate a high voltage output signal that has a voltage higher than the input signal. In order to accomplish such smoothing, may require that the input signal include at least one of a high frequency, fast rise times, and fast fall times. In some embodiments, the high frequency of the input signal may be five to ten times greater than the output signal. Moreover, the higher the input frequency of the input signal, the smoother the output signal.

In some embodiments, the pulse generator may generate high voltage pulses with fast rise times of various types such as, for example, square waves, sinusoidal waves, triangular waves, arbitrary waves, long single pulses, multiple pulses, etc.

In some embodiments, a pulse generator may generate high voltage pulses having an arbitrary waveform that has a fast rise time (e.g., less than 1 μs). In some embodiments, a pulse generator may generate a high voltage pulses that have a variable duty cycle or user controlled duty cycle.

In some embodiments, a pulse generator can output high voltage greater than 0.5 kV, 1.0 kV, 2.0 kV, 5.0 kV, 10 kV, 15 kV, 20 kV, 25 kV, 50 kV, 100 kV, or 1,000 kV.

In some embodiments, the input signal may be greater than about 50 kHz or 100 kHz.

Embodiments described within this document do not include, for example, DC-DC converters, despite that some embodiments may be capable of generating a DC output. For example, a pulse generator does not simply convert a source of direct current (DC) from one voltage level to another. Indeed, embodiments described within this document are different than other pulse generators and/or different than DC-DC converters. For example, embodiments described within this document are not optimized for converting direct current from one voltage to another level. As another example, a pulse generator may produce pulses with long pulse widths, fast rise times, and/or fast fall times, but does not in general produce a DC output signal. Instead, some embodiments described within this document may produce high voltage pulses with fast rise times and/or fast fall times. Some embodiments described within this document may produce high voltage pulses having a long high voltage pulse or with a long pulse width that have a fast rise time and/or a fast fall time. Some embodiments described within this document may produce high frequency and high voltage pulses with any waveform shape. As another example, embodiments described within this document may produce one or more waveforms and/or signals with specifically designated very low frequency components as well as waveforms with specifically designated very high frequency components. Moreover, in some embodiments, a pulse generator may produce waveforms that are galvanically isolated from a reference potential (e.g., ground).

FIG. 1 is an example block diagram of a pulse generator 100 according to some embodiments. The pulse generator 100 may include one or more stages or blocks as shown in the figure. One or more of these stages may be removed, replaced with another stage, and/or combined with another stage. A driver stage 105 that includes any components or devices that may push or pull current. The driver stage 105 is coupled with a balance stage 110. The balance stage 110 can be used, for example, to keep a transformer stage 115 from saturating due to imbalanced current. The driver stage may include one or more energy sources, switches, bridges, etc. The one or more switches may include, for example, one or more IGBTs, switches, solid state switches, MOSFET, may be used to switch the energy source. As another example, the driver stage may include a waveform generator that may be used to produce an input waveform. In some embodiments, a waveform that is to be amplified may be provided to the driver from an external source. In some embodiments, an IGBT circuit(s) may be used with the driver stage 105 such as, for example, the IGBT circuit discussed in U.S. patent application Ser. No. 13/345,906, entitled Efficient IGBT Switching the entirety of which is incorporated by reference in its entirety.

Figure 4:
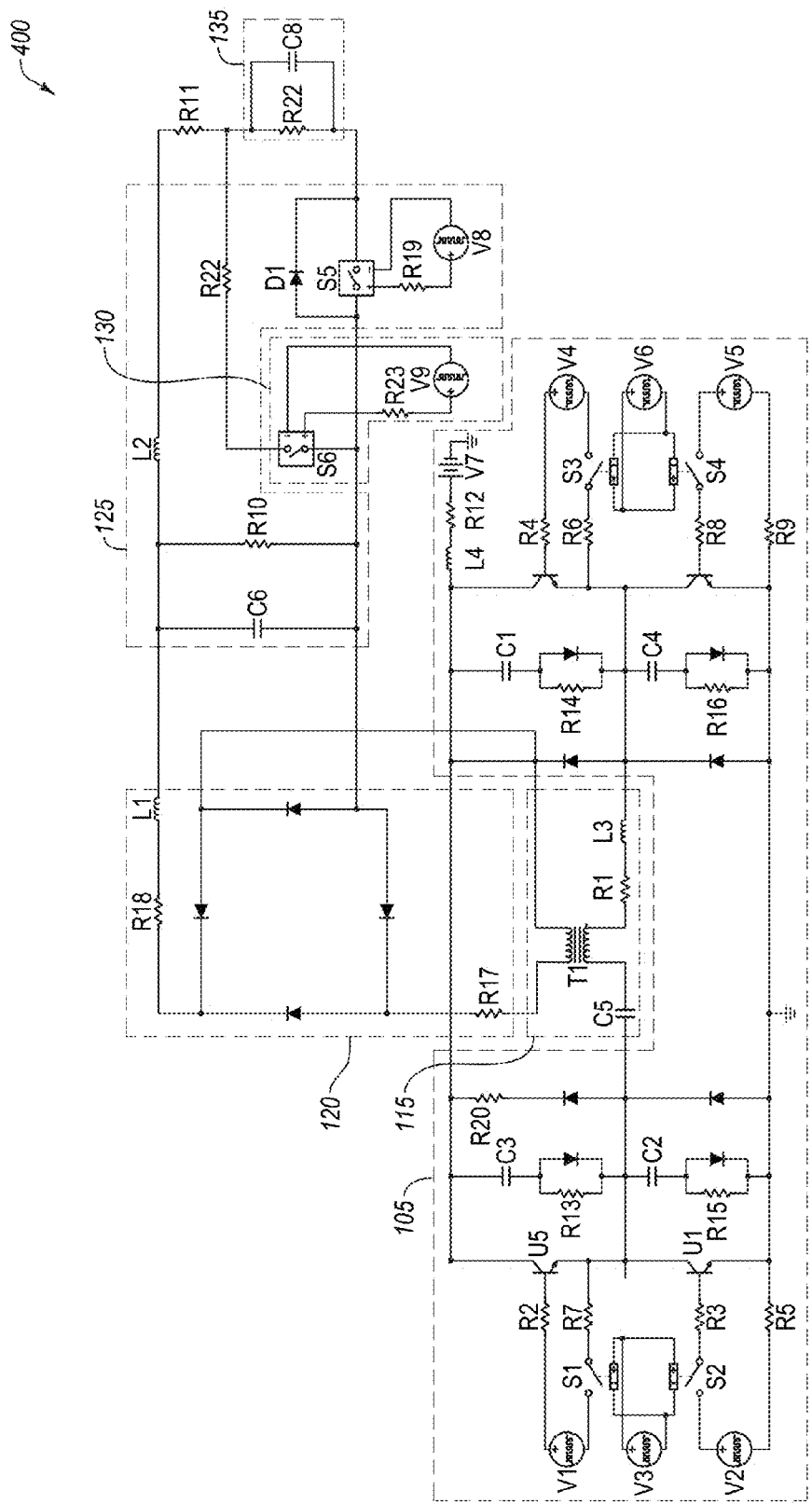
FIG. 4 is an example circuit diagram that may comprise all or part of a pulse generator according to some embodiments described in this document.

In some embodiments, the driver stage 105 may include an H-bridge, a half bridge, or a full bridge. An example of a full bridge configuration is shown in FIG. 4. Any number of configurations of input sources may be used without limitation. Various other configurations or circuits may be included such as, for example, resonant topologies and push-pull topologies.

At fixed voltage, the time rate of change of current through a given circuit may be inversely proportional to the inductance of the circuit. Thus, in some embodiments, in order to produce fast rise times, the driver stage 105, for example, may have a low total inductance. In some embodiments, the driver stage 105 may have a total inductance below 1,000 nH. In some embodiments, the inductance of all components, circuits, elements, etc. prior to a transformer or transformers of a transformer stage may have a total inductance less than 1,000 nH. In some embodiments, the inductance of all components, circuits, elements, etc. including the primary winding of one of more transformers of the transformer stage 115 may have an inductance less than 1,000 nH. In some embodiments, the inductance of all components, circuits, elements, etc. om the driver stage 105 and the balance stage 110 may have a total inductance less than 1,000 nH.

In some specific embodiments, the driver stage 105 may have a total inductance below 1,000 nH. In some specific embodiments, the inductance of all components, circuits, elements, etc. prior to a transformer or transformers of a transformer stage may have a total inductance less than 1,000 nH. In some specific embodiments, the inductance of all components, circuits, elements, etc. including the primary winding of one of more transformers of the transformer stage 115 may have an inductance less than 1,000 nH. In some specific embodiments, the inductance of all components, circuits, elements, etc. om the driver stage 105 and the balance stage 110 may have a total inductance less than 1,000 nH.

The balance stage 110 may also be coupled with the transformer stage 115 that may include one or more transformers each having any number of coils. The transformer stage 115 may also increase the voltage from the driver stage 105 and/or the balance stage 110 depending on the number of winds on either side of the transformer stage 115. The transformer stage 115 may provide, for example, galvanic isolation between the driver stage 105 and the output stage 135. The transformer stage 115 may also provide, for example, step up from the input voltage provided by the driver stage 105 to an increased voltage output.

The transformer stage 115 may be coupled with a rectifier stage 120. The filter stage 125 may be coupled with the rectifier stage 120. The filter stage 125 may include any number of components such as, for example, active components (e.g., switches, diodes, etc.) and/or passive components (e.g., inductors, capacitors, resistors, etc.)

The transformer stage may include a transformer that transforms an input signal into a high voltage output signal. The high voltage output signal may have a voltage of 500 volts, 1,000 volts, 2000 volts, 10,000 volts and/or 100,000 volts, or higher.

The sink stage 130 may be placed after the filter stage 125 as shown in FIG. 1 or placed before the filter stage 125. The sink stage 130 may, for example, dump energy, sink current, and/or rapidly reverse current flow of any energy stored in the filter stage 125 and/or the output stage 135.

The output stage 135 may be coupled with the sink stage 130 as shown in FIG. 1 or may be coupled with the filter stage 125 and/or the rectifier stage 120. The output stage 135 may include the load and/or the device to which the output signal is sent. The output stage 135 may be galvanically isolated form a reference signal, from ground, and/or from the driver stage 105. In some embodiments, the output stage can be floating or biased to any potential desired (e.g., with the DC bias stage 140). In some embodiments, the output stage 135 may output a signal with a rise time of less than 100 ns and/or a fall time of less than 100 ns.

The DC bias stage 140 may be coupled with the output stage 135 and may include any voltage source and/or power source. The DC bias stage 140, for example, may be connected with a reference signal, ground, and/or the driver stage. In some embodiments, the DC bias stage 140 may reference the potential of the output stage 135 to the potential of the driver stage 105 of the pulse generator 100. The DC bias stage 140, for example, may be coupled to the rectifier stage 120, the filter stage 125, the sink stage 130, and/or the output stage 135. The DC bias stage 140, for example, may be of any polarity and/or may include any voltage. In some embodiments, the DC bias stage 140 may provide a DC bias signal, for example, having a voltage greater than 0.01 kV, 0.1 kV, 1 kV, 3 kV, 10 kV, 30 kV, or 100 kV. In some specific embodiments, the DC bias voltage may be greater than 0.1 kV or 1 kV.

FIG. 2A is an example driver stage 105 according to some embodiments described in this document. The driver stage 105, for example, may include any device or components that may push or pull current in the pulse generator 100. The driver stage 105, for example, may include one or more high voltage power supplies or voltage sources that may provide an input voltage of 50 volts, 100 volts, 200 volts, 300 volts, 400 volts, 500 volts, 600 volts, 700 volts, 800 volts, 900 volts, etc. to over 4500 volts. The driver stage 105, for example, may include one or more solid state switches such as, for example, one or more IGBTs and/or one or more MOSFETs that can be used to the switch the high voltage power supply. In some embodiments, the solid state switches may operate at voltages up to 2 kV or up to 4.5 kV.

In some embodiments, the driver stage 105 may include one or more H-bridge circuits and/or half-bridge circuits operated in parallel. Each H-bridge circuit may include, for example, one or more solid state switches. Moreover, the driver stage 105, for example, may or may not be coupled with a reference signal and/or with ground potential. The one or more solid state switches, for example, may switch at a frequency of 0.1 kHz, 1 kHz, 10 kHz, 100 kHz, 1,000 kHz, 10,000 kHz, etc.

In FIG. 2A, the stray inductance, L1 and L2, of the driver stage 105 singularly or in combination may be less than 1 nH, 10 nH, 100 nH, 1,000 nH, 10,000 nH, etc. In some specific embodiments, the stray inductance L1 and/or L2 may be less than 100 nH or 1,000 nH. In some specific embodiments, the stray inductance, L1 and L2, may represent and/or include all inductance such as, for example, stray inductance in the circuit, inductors, inductance in components, etc.

In some embodiments, the driver stage 105 may include one or more power sources that may provide voltage at 50 volts, 100 volts, 200 volts, 300 volts, 400 volts, 500 volts, 600 volts, 700 volts, 800 volts, 900 volts, etc. to over 4500 volts. In some specific embodiments, the voltage provided by the one or more power sources in the driver stage 105 may be greater than 100 V or 500 V.

FIG. 2B is an example balance stage 110 according to some embodiments described in this document. In FIG. 2B, the balance stage 110 is not used and/or may not include, for example, any active or passive components except, possibly, a connection between the driver stage 105 and the transformer stage.

FIG. 2C is another example balance stage 110 according to some embodiments described in this document. In this example, the balance stage 110 includes blocking capacitor C1, which may keep the transformer stage 115 from saturating due to imbalanced current from the driver stage 105. The blocking capacitor C1 may have a capacitance value of greater than 1 µF, 10 µF, 100 µF, 1,000 µF, 10,000 µF, etc.

FIG. 2D is another example balance stage 110 according to some embodiments described in this document. In this example, the balance stage 110 includes blocking capacitor C2 and blocking capacitor C3, which may keep the transformer stage 115 from saturating due to imbalanced current from the driver stage 105. The blocking capacitor C2, for example, may have a capacitance value of greater than 1 µF, 10 µF, 100 µF, 1,000 µF, 10,000 µF, etc. The blocking capacitor C3 may have a capacitance value of greater than 1 µF, 10 µF, 100 µF, 1,000 µF, 10,000 µF, etc.

FIG. 2E is an example transformer stage 115 according to some embodiments described in this document. The transformer stage 115, for example, may include one or more transformers. A transformer of the transformer stage 115, for example, may step up the voltage provided by the driver stage 105 to a higher voltage such as for example, over 500 volts, 1500 volts, 2500 volts, 50,000 volts, 250,000 volts, etc.

The transformer, for example, may include a primary side 116 and a secondary side 117. The primary side 116 may have a total effective series stray inductance L3 and L4 that may have an inductance singularly or in combination of less than 10 nH, 100 nH, 1,000 nH, or 10,000 nH. In some specific embodiments, the total effective series stray inductance L3 and L4 may be less than 1,000 nH. In some specific embodiments, the secondary side 117 may have a total effective parallel stray capacitance C4 of less than 1 pF, 10 pF, 100 pF, 1,000 pF, 10,000 pF, etc. In some specific embodiments, the total effective parallel stray capacitance C4 may be less than 100 pF or 1,000 pF.

The transformer stage 115 may comprise any type of transformer. In some embodiments, the transformer may include primary windings on the primary side 116 and secondary windings on the secondary side 117 that are both wrapped around a magnetic core such as, for example, a ferrite core. The ratio ($N_s/N_p$) of the number secondary windings ($N_s$) to the number of primary windings ($N_p$) may be greater than 2, 4, 5, 5.5, 8, 10, 150, 600, etc.

In some embodiments, the transformer stage 115 may include one or more transformers arranged in parallel with each other.

In some embodiments, the transformer stage 115 may output a voltage greater than 1 kV, 2 kV, 5 kV, 10 kV, 30 kV, 100 kV, 300 kV, or 1,000 kV.

FIG. 2F is an example rectifier stage 120 according to some embodiments described in this document. The rectifier stage 120 may include, for example, total effective series stray inductance L5 and L6 singularly or in combination of less than 10 nH, 100 nH, 1,000 nH, 10,000 nH, etc. In some specific embodiments, the effective series stray inductance L5 and L6 singularly or in combination may be less than 1,000 nH. In some other specific embodiments, the effective series stray inductance L5 and L6 singularly or in combination may be less than 100 nH. In some embodiments, the rectifier stage 120 may include total effective parallel stray capacitance C5 of less than 1 pF, 10 pF, 100 pF, 1,000 pF, 10,000 pF, etc. In some specific embodiments, the capacitance of the total effective parallel stray capacitance C5 may be less than 1,000 pF. In some specific embodiments, the capacitance of the total effective parallel stray capacitance C5 may be less than 200 pF. The rectifier stage 120 may also include a plurality of diodes, that may be used in series and/or parallel configurations that are designed and have specifications sufficient for high voltage and/or high power applications.

The rectifier stage 120 may include any type of rectifier such as, for example, a single phase rectifier, a single phase half wave rectifier, a single phase full wave rectifier, a full wave rectifier, a three-phase rectifier, a three-phase half wave circuit, a three-phase bridge rectifier, a two pulse bridge, a twelve pulse bridge, etc. In some embodiments, more than one rectifier may be used in series and/or parallel.

Figure 3A:
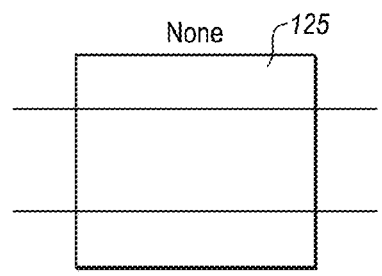
FIG. 3A is an example filter stage according to some embodiments described in this document.
Figure 3B:
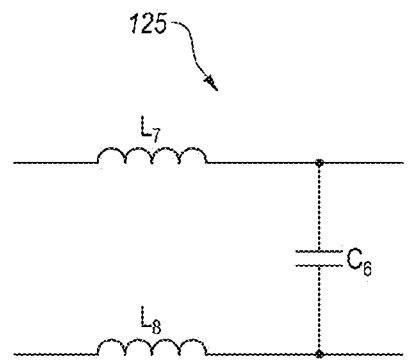
FIG. 3B is an example filter stage according to some embodiments described in this document.
Figure 3C:
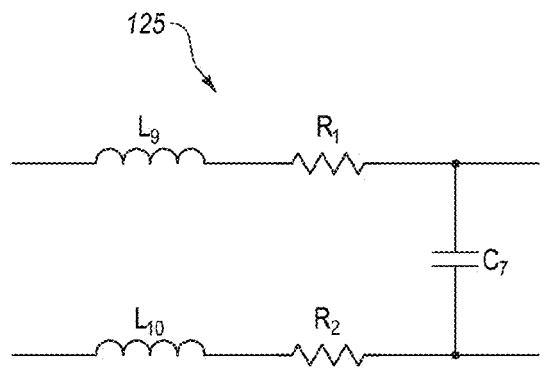
FIG. 3C is an example filter stage according to some embodiments described in this document.

The filter stage 125 may include a number of different configurations depending on the type of specification and/or application. Three examples are shown in FIG. 3A, FIG. 3B, and FIG. 3C. In some embodiments, the filter may include only passive elements such as, for example, inductors, capacitors, resistors, etc. Various other configurations may be used.

FIG. 3A is an example filter stage 125 according to some embodiments described in this document. In this configuration, the filter stage 125 does not include any components. In this configuration, the output of the rectifier stage 120 may be tied directly with the output stage 135 and/or the load. This filter stage may be used to produce an output signal that includes at least one of fast rise times, fast fall times, and high frequencies, etc.

FIG. 3B is an example filter stage 125 according to some embodiments described in this document. In this configuration, the filter stage 125 may include total effective series inductance L7 and L8 singularly or in combination of less than 0.1 µH, 1 µH, 10 µH, 100 µH, 1,000 µH, 10,000 µH, etc. In some specific embodiments, the total effective series inductance L7 and L8 singularly or in combination may be less than 30 µH. The filter stage 125 may include total effective parallel capacitance C6 of less than 0.01 nF, 0.1 nF, 1 nF, 10 nF, 100 nF, 1,000 nF, etc. In some specific embodiments, the total effective parallel capacitance C6 may be less than 300 µF or 30 µF. This configuration, for example, may be used to smooth an input waveform provided by the driver stage 105 and/or allow for an arbitrary waveform.

FIG. 3C is an example filter stage 125 according to some embodiments described in this document. In this configuration, the filter stage 125 may include total effective series inductance L9 and L10 singularly or in combination of less than 0.1 µH, 1 µH, 10 µH, 100 µH, 1,000 µH, 10,000 µH, etc. In specific embodiments, the total effective series inductance L9 and L10 singularly or in combination may be less than 30 µH.

In some embodiments, the filter stage 125 may include total effective parallel capacitance C7 of less than 0.01 nF, 0.1 nF, 1 nF, 10 nF, 100 nF, 1,000 nF, etc. In some specific embodiments, the total effective parallel capacitance C7 may be less than 300 µH or 30 µH. The filter stage 125 may include, for example, total effective parallel resistance R1 and R2 singularly or in combination of less than 0.1 Ohms, 1 Ohms, 10 Ohms, or 100 Ohms. In some specific embodiments, the total effective parallel resistance R1 and R2 singularly or in combination may be less than 10 Ohms or less than 1 Ohm. This configuration, for example, may be used to smooth an input waveform provided by the driver stage 105 and/or allow for an arbitrary waveform.

Various other configurations of filter stage 125 may be used.

Figure 3D:
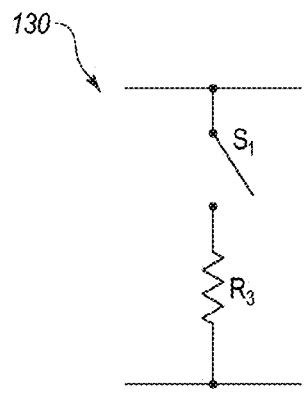
FIG. 3D is an example sink stage according to some embodiments described in this document.

FIG. 3D is an example sink stage 130 according to some embodiments described in this document. Sink stage 130 may include a switch S1 and a resistance R3. The resistance R3 may include stray resistance and/or a resistor that may be used to limit the current flowing through switch S1. When the switch S1 is closed, the sink stage 130 may rapidly dump energy that may be stored in the filter stage 125 and/or the output stage 135 such as, for example, any energy stored in a capacitor in the filter stage 125 and/or the output stage 135. In some embodiments, the sink stage 130 may be located between the filter stage 125 and the rectifier stage 120. In other embodiments the sink stage 130 may be disposed between the filter stage 125 and the output stage 135.

FIG. 4 is an example circuit diagram 400 that may comprise all or part of a pulse generator according to some embodiments described in this document. The circuit diagram 400 includes driver stage 105, transformer stage 115, rectifier stage 120, filter stage 125, sink stage 130, and output stage 135.

In some embodiments, the output stage 135 can be galvanically isolated from ground, from the driver stage, and/or from any reference potential.

In this embodiment, the filter stage 125 includes a switch S5. The output of the rectifier stage 120 can then be directly switched by the switch S5.

The sink stage 130 may include switch S6. In some embodiments, switch S5 and switch S6 may be fast switches that open and close within 1 µs or faster. In some embodiments, the switch S5 and/or the switch S6 are switches that may operate at high frequencies.

Figure 5A:
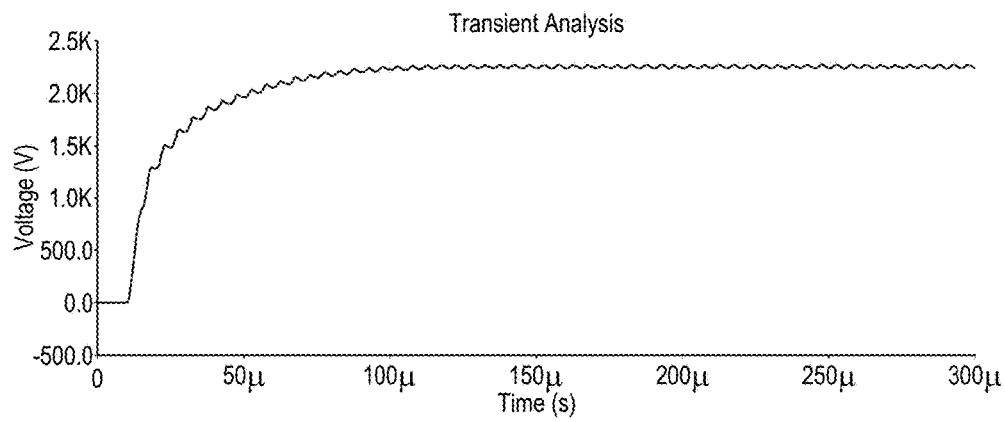
FIGS. 5A, 5B and 5C are example graphs of an output pulse according to some embodiments described in this document.
Figure 5B:
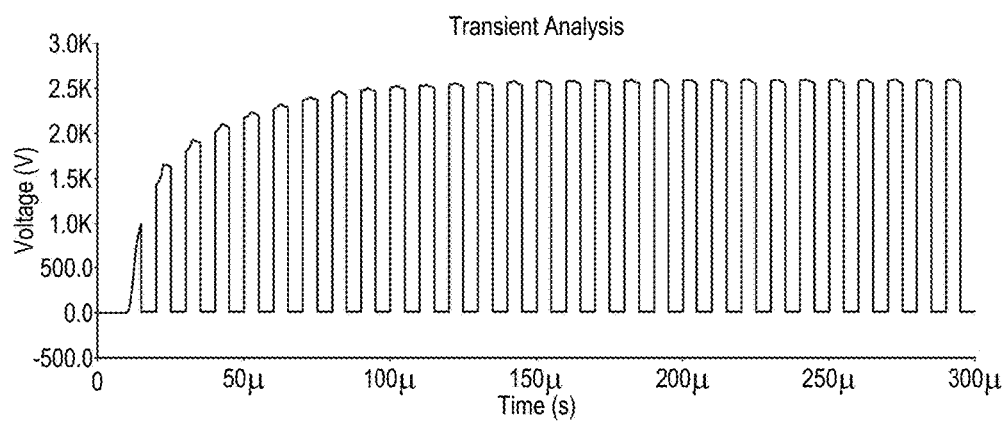
Figure 5C:
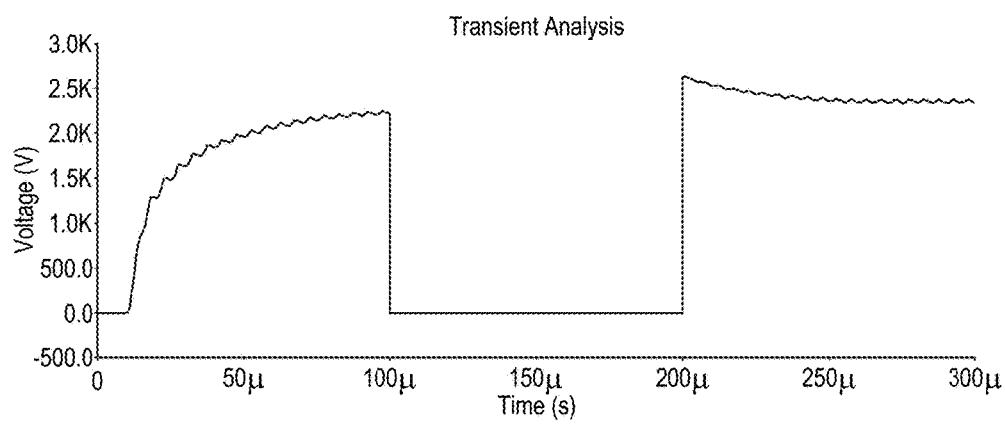

When the switch S5 is closed DC power can be sourced to the output stage 135 (or the load R22 and/or R11). A graph of the voltage over time at the output stage 135 is shown in FIG. 5A. If switch S5 is switched on and off, then a pulsed waveform can be sourced to the output stage 135 as shown in FIG. 5B and FIG. 5C. Switch S6 can be opened when switch S5 closes and closed when switch S5 opens. When switch S6 is closed, capacitance can be drained from the load capacitance represented as C8. The switches used by switch S5 and/or switch S6 may operate at high power, high frequency, with variable duty cycle, at variable pulse widths, etc.

Switch S5 and/or switch S6 may include one or more solid state switches such as, for example, one or more MOSFETs and/or one or more IGBTs. Moreover, in some embodiments, switch S5 and/or switch S6 may also include one or more switches stacked, arranged in parallel, and/or arranged in series.

In some embodiments, a controller may be included that controls the operation and/or timing of switch S5 and/or switch S6 as the duty cycle, pulse width, and/or frequency are changed and to ensure that switch S5 is closed when switch S6 is open and vice-versa. These switches may include solid state switches and/or IGBT circuits discussed in U.S. patent application Ser. No. 13/345,906, entitled Efficient IGBT Switching the entirety of which is incorporated into this document by reference in its entirety.

In some embodiments, the emitter of switch S5 and/or switch S6 may not be referenced back to ground. That is, the emitter of switch S5 and/or switch S6 may be galvanically isolated from all or part of the circuit. Moreover, the gate of switch S5 and/or switch S6 may be isolated using a fiber optic receiver and/or a fiber optic device.

In some embodiments, the size, shape, frequency, and/or duty cycle of pulses produced by the pulse generator may be controllable (or varied by user input). For example, the pulses can vary from a DC output to a 10 MHz output with duty cycles from 0% to 100%. In some embodiments, the galvanic isolation allows the output waveform potential to be set to arbitrary potential levels with respect to other system potentials. In some embodiments galvanic isolation may be 500 V, 1 kV, 2 kV, 3 kV, 5 kV, 10 kV, 20 kV, 100 kV, etc. with respect to other potentials. Some embodiments include a combination of two or more output stages to both provide and to sink high power and/or currents to and from the load. The combination of output stages may allow for precise control of arbitrary pulses to be delivered to both resistive and capacitive loads.

FIGS. 5A, 5B and 5C illustrate the variability of the output from a pulse generator. FIG. 5A is an example graph of a DC output pulse of over 2 kV. FIG. 5B is an example graph of an output pulse of over 2 kV pulsing at 100 kHz. And FIG. 5C is an example graph of an output pulse of over 2 kV pulsing at 5 kHz. Various other frequencies and/or amplitudes may be output using embodiments described in this document.

Figure 6:
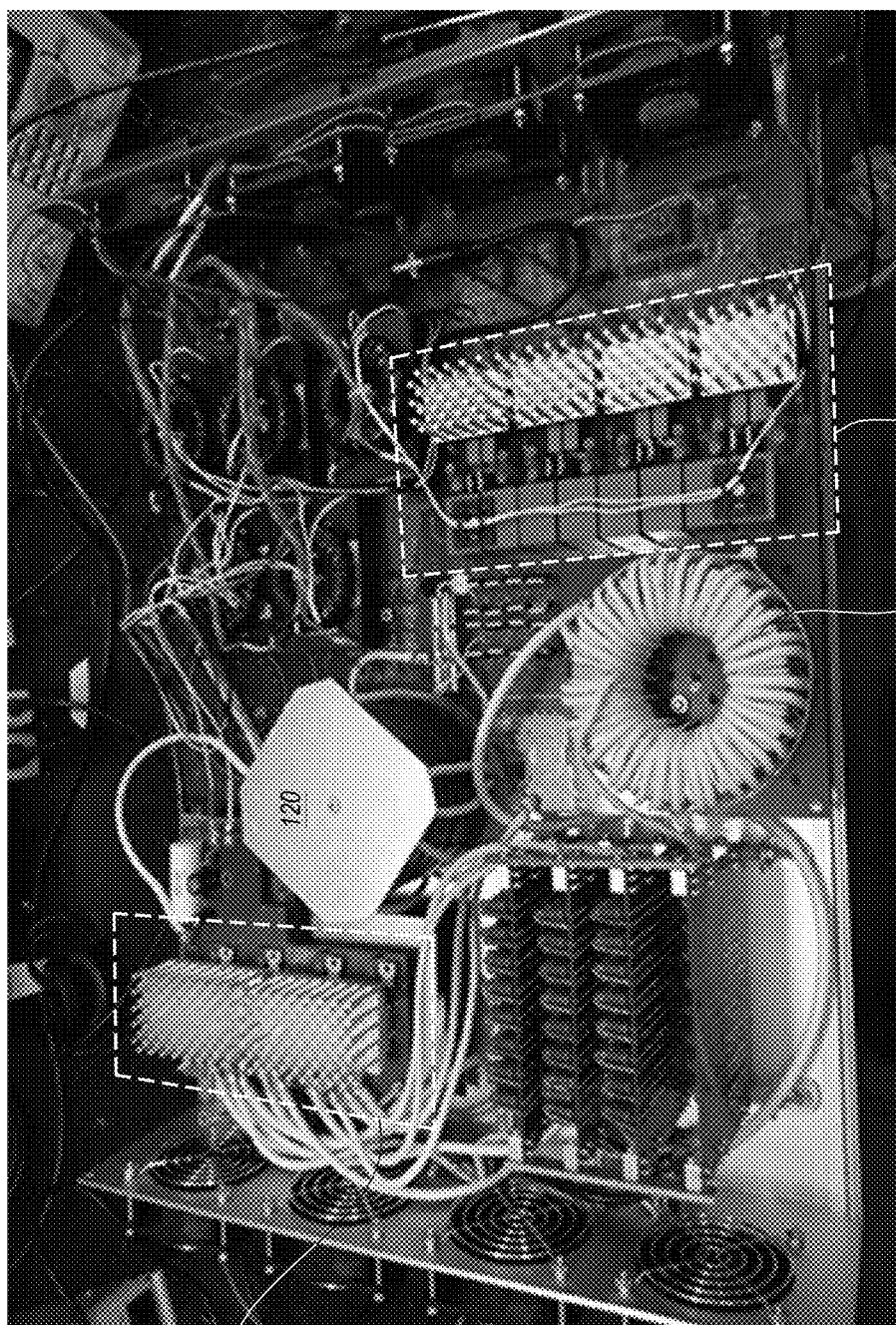
FIG. 6 is an example pulse generator according to some embodiments described in this document.

FIG. 6 is an example pulse generator according to some embodiments described in this document. The pulse generator includes an output stage 135, a rectifier stage 120, a transformer stage 115, and a driver stage 105.

Figure 7A:
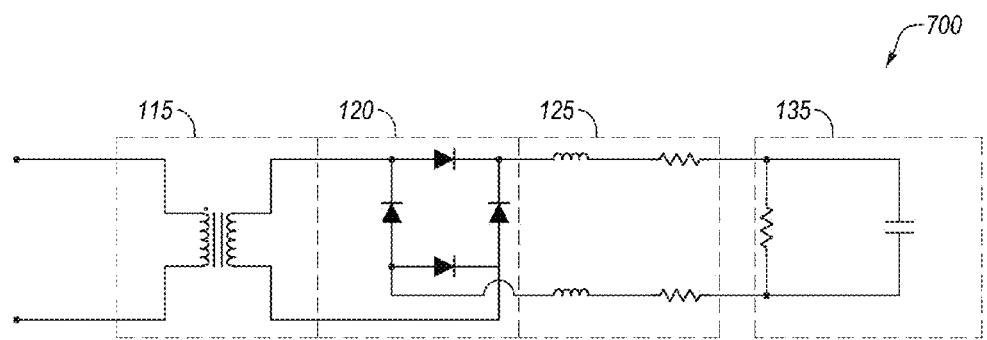
FIG. 7A is an example circuit diagram of a portion of a pulse generator according to some embodiments described in this document.

FIG. 7A is an example circuit diagram 700 of a portion of a pulse generator according to some embodiments described in this document. The circuit diagram 700 shows a transformer stage 115 that includes a 1:5.5 transformer. The circuit diagram 700 also shows a rectifier stage 120, a filter stage 125, and an output stage 135. The filter stage 125 in this example includes circuit elements that include two 125 µH inductors and two 10 ohm resistors. While this example shows specific circuit elements with specific values, various other elements may be included. The output stage 135 includes a 250 Ohm load with 2 nF capacitance.

Figure 7B:
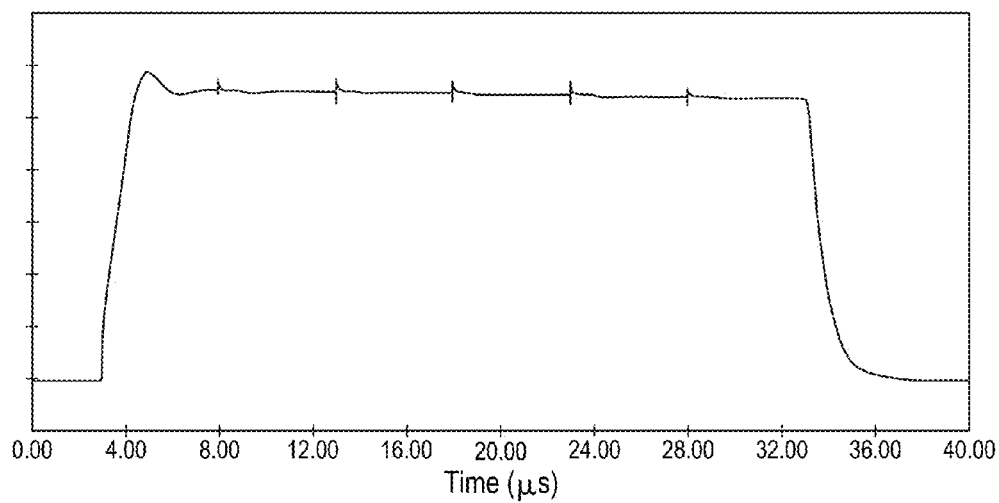
FIG. 7B is an example of an output waveform produced from the pulse generator shown in FIG. 7A.

FIG. 7B is an example of an output waveform produced from the portion of a pulse generator shown in FIG. 7A. The input waveform may include a low voltage (e.g., less than 200 V) input square waveform that may be provided via $V_{CH}$ and/or the driver stage 105. The input square waveform in this example was square wave with 5 µs pulse widths such as, for example, the waveform shown in FIG. 11A. As shown, the output waveform has an approximately 2 µs rise time and/or a very clean pulse.

Figure 8A:
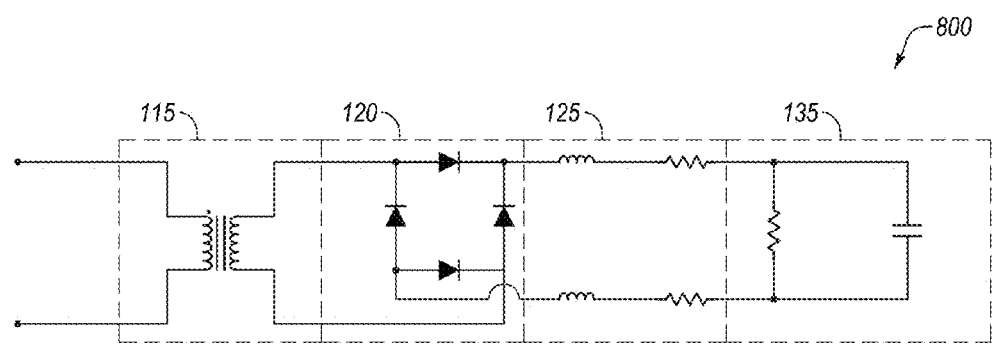
FIG. 8A is an example circuit diagram of a portion of a pulse generator according to some embodiments described in this document.

FIG. 8A is an example circuit diagram 800 of a portion of a pulse generator according to some embodiments described in this document. The circuit diagram 800 shows a transformer stage 115 that includes a 1:5.5 transformer. The circuit diagram 800 also shows a rectifier stage 120, a filter stage 125, and an output stage 135. The filter stage 125 in this example includes circuit elements that include two 480 µH inductors and two 10 ohm resistors. While this example shows specific circuit elements with specific values, various other elements may be included. The output stage 135 includes a 1 kOhm load with 470 pF capacitance.

Figure 8B:
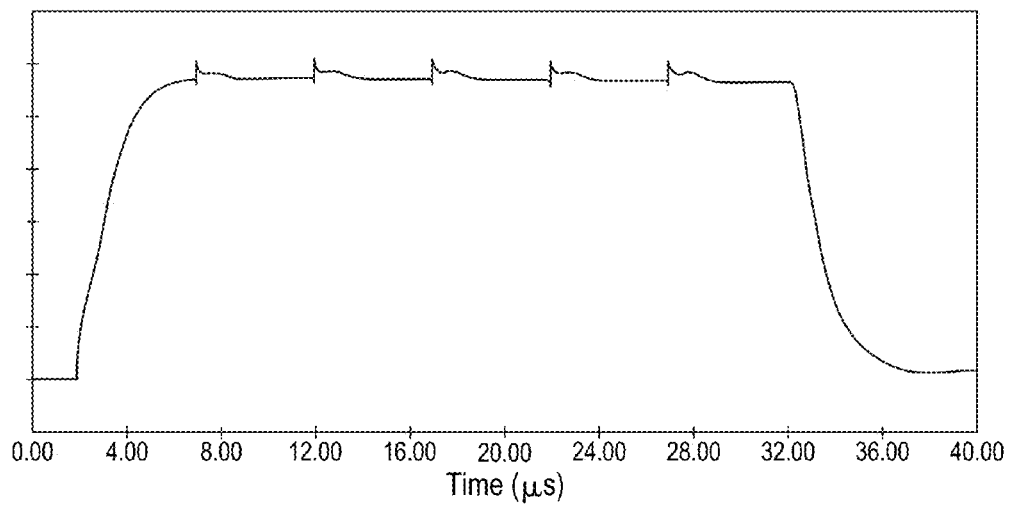
FIG. 8B is an example of an output waveform produced from the pulse generator shown in FIG. 8A.

FIG. 8B is an example of an output waveform produced from the pulse generator shown in FIG. 8A. The input waveform may include a low voltage (e.g., less than 200 V) input square waveform that may be provided via $V_{CH}$ and/or the driver stage 105. The input square waveform in this example was square wave with 5 µs pulse widths such as, for example, the waveform shown in FIG. 11A. As shown, the output waveform has an approximately 2 µs rise time and/or a relatively clean pulse.

Figure 9A:
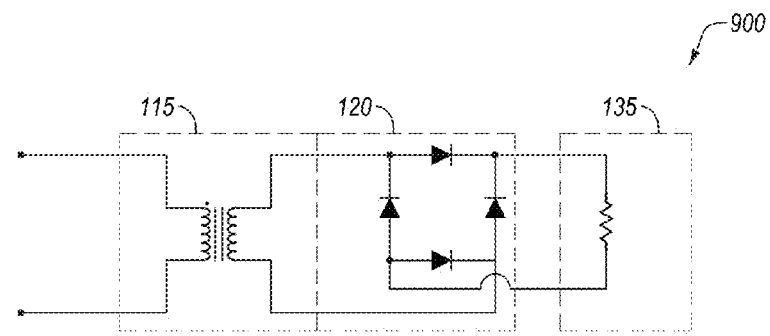
FIG. 9A is an example circuit diagram of a portion of a pulse generator according to some embodiments described in this document.

FIG. 9A is an example circuit diagram 900 of a portion of a pulse generator according to some embodiments described in this document. The circuit diagram 900 shows a transformer stage 115 that includes a 1:5.5 transformer. The circuit diagram 900 also shows a rectifier stage 120 and an output stage 135, but no filter stage 125. The output stage 135 includes a 250 Ohm load.

Figure 9B:
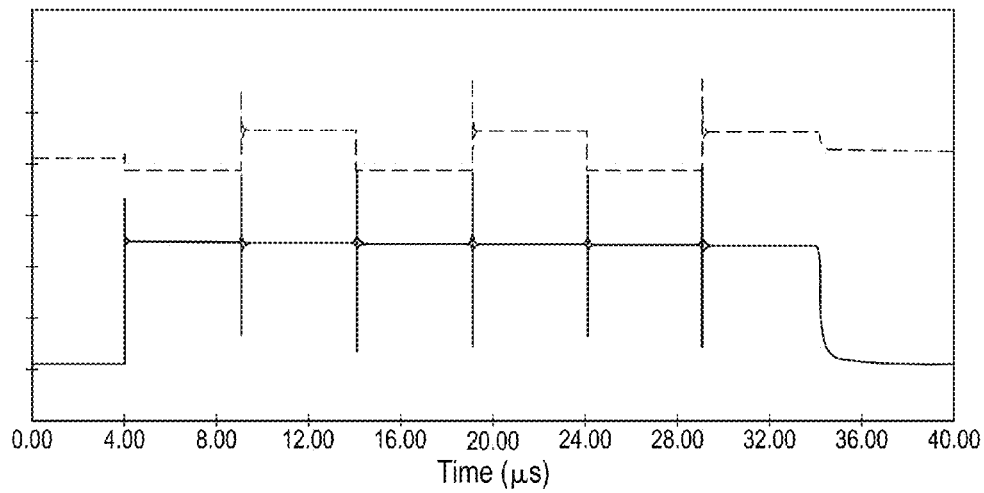
FIG. 9B is an example of an output waveform produced from the pulse generator shown in FIG. 9A.

FIG. 9B is an example of an output waveform produced from the pulse generator shown in FIG. 9A compared with the input waveform. A 200 V input square wave (dashed) was provided via $V_{CH}$. As shown, the output waveform (solid) has a very sharp rise time and maintains a relatively clean flat top with some slight ripple.

Figure 9C:
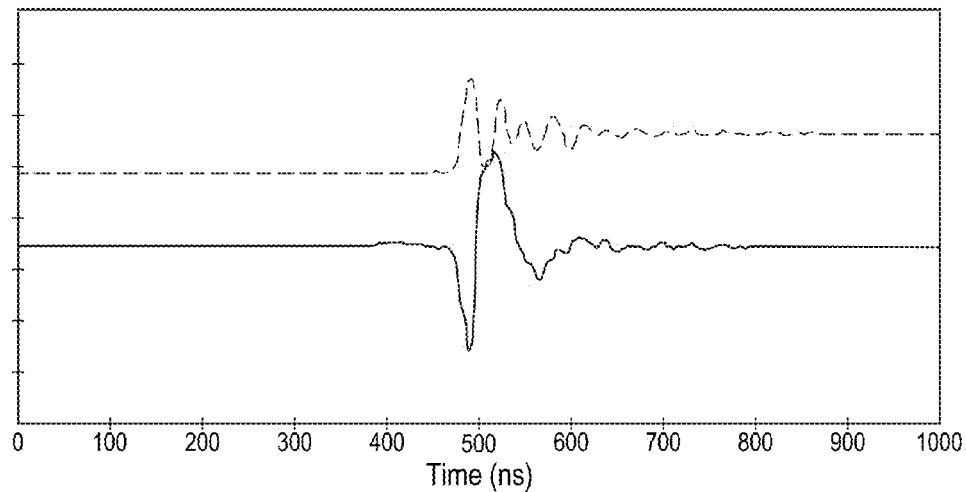
FIG. 9C is another example of an output waveform produced from the pulse generator shown in FIG. 9A.

FIG. 9C is an example of an output waveform produced from the pulse generator shown in FIG. 9A compared with the input waveform into the transformer stage 115. The input waveform may include a low voltage (e.g., less than 200 V) input square waveform that may be provided via $V_{CH}$. As shown, the output waveform has a very sharp rise time and maintains a relatively clean flat top with some slight ripple.

Figure 10A:
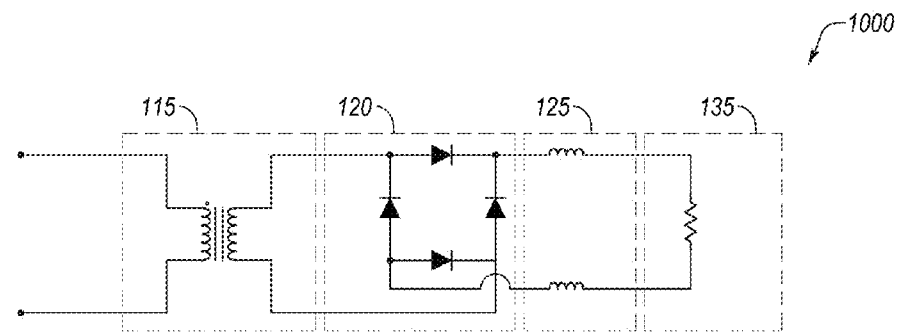
FIG. 10A is an example circuit diagram of a portion of a pulse generator according to some embodiments described in this document.

FIG. 10A is an example circuit diagram 1,000 of a portion of a pulse generator according to some embodiments described in this document. The circuit diagram 1,000 shows a transformer stage 115 that includes a 1:5.5 transformer. The circuit diagram 1,000 also shows a rectifier stage 120, a filter stage 125, and an output stage 135. The filter stage 125 in this example includes circuit elements that include two 450 µH inductors. While this example shows specific circuit elements with specific values, various other elements may be included. The output stage 135 includes a 250 Ohm load.

Figure 10B:
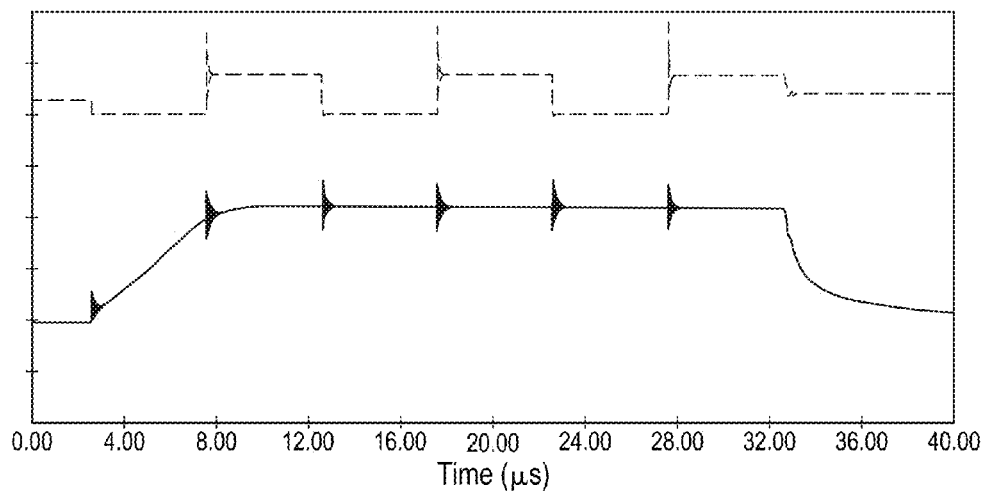
FIG. 10B is an example of an output waveform produced from the pulse generator shown in FIG. 10A compared with the input waveform.

FIG. 10B is an example of an output waveform produced from the pulse generator shown in FIG. 10A compared with the input waveform. A 200 V input square wave (dashed) was provided via $V_{CH}$. As shown, the output waveform (solid) has a sharp rise time and maintains a clean flat top with some slight ripple.

Figure 10C:
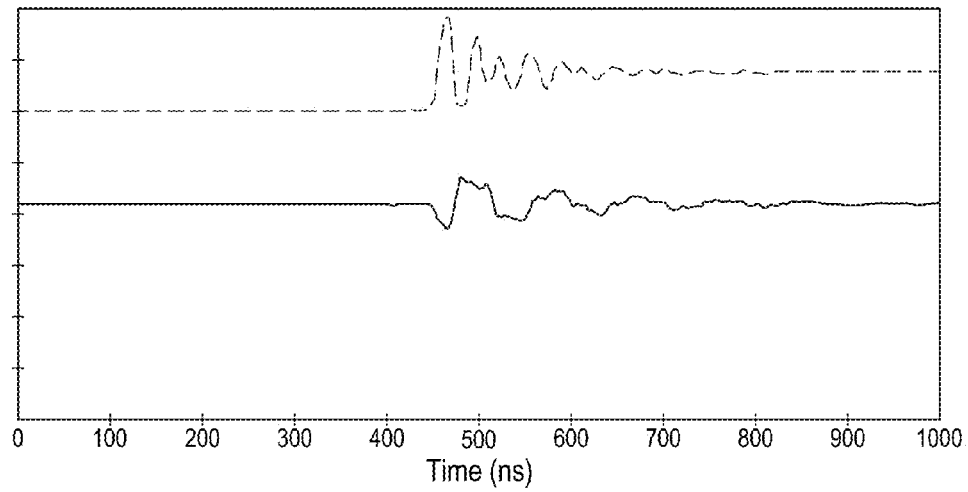
FIG. 10C is an example of an output waveform produced from the pulse generator shown in FIG. 10A compared with the input waveform.

FIG. 10C is an example of an output waveform produced from the pulse generator shown in FIG. 10A compared with the input waveform. A 200 V input wave (dashed) with an arbitrary shape was provided via $V_{CH}$. As shown, the output waveform has a very sharp rise time and maintains a relatively clean flat top with some slight ripple.

Figure 11A:
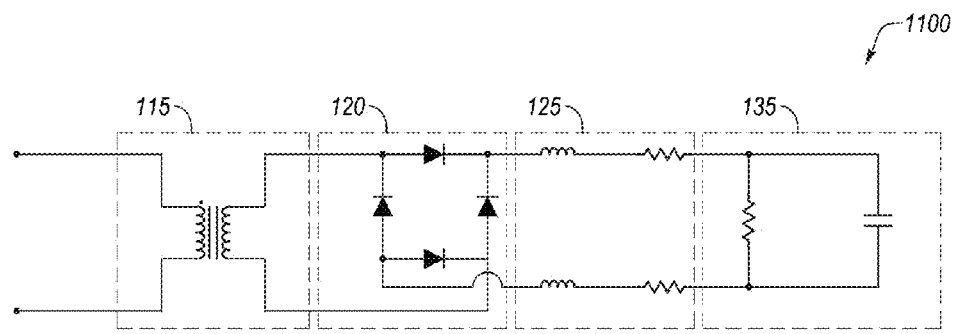
FIG. 11A is an example circuit diagram of a portion of a pulse generator according to some embodiments described in this document.

FIG. 11A is an example circuit diagram 1100 of a portion of a pulse generator according to some embodiments described in this document. The circuit diagram 1100 shows a transformer stage 115 that includes a 1:5.5 transformer.

The circuit diagram 1100 also shows a rectifier stage 120, a filter stage 125, and an output stage 135. The filter stage 125 in this example includes circuit elements that include two 125 μH inductors and two 10 ohm resistors. While this example shows specific circuit elements with specific values, various other elements may be included. The output stage 135 includes a 250 Ohm load with 2 nF capacitance.

Figure 11B:
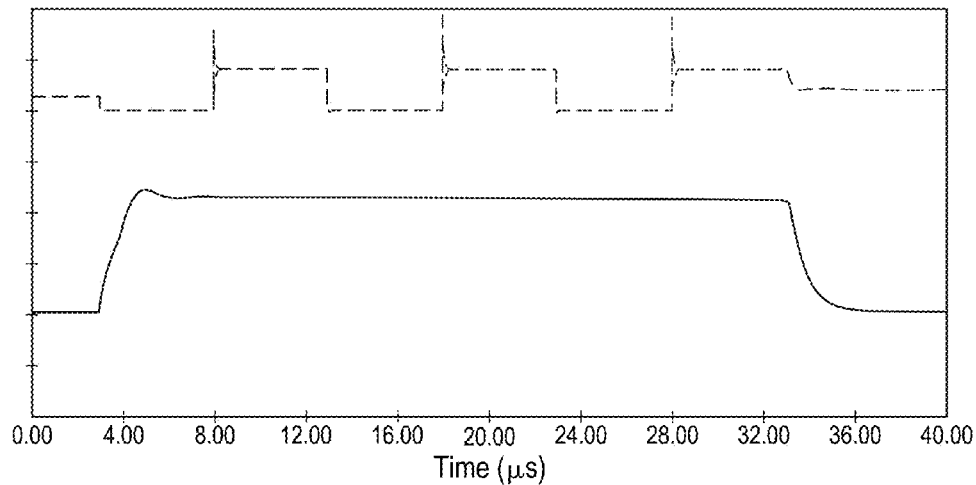
FIG. 11B is an example of an output waveform produced from the pulse generator shown in FIG. 11A compared with the input waveform.

FIG. 11B is an example of an output waveform produced from the pulse generator shown in FIG. 11A compared with the input waveform. A 200 V input square wave (dashed) was provided via $V_{CH}$. As shown, the output waveform (solid) has a sharp rise time and maintains a clean flat top with very little ripple.

Figure 11C:
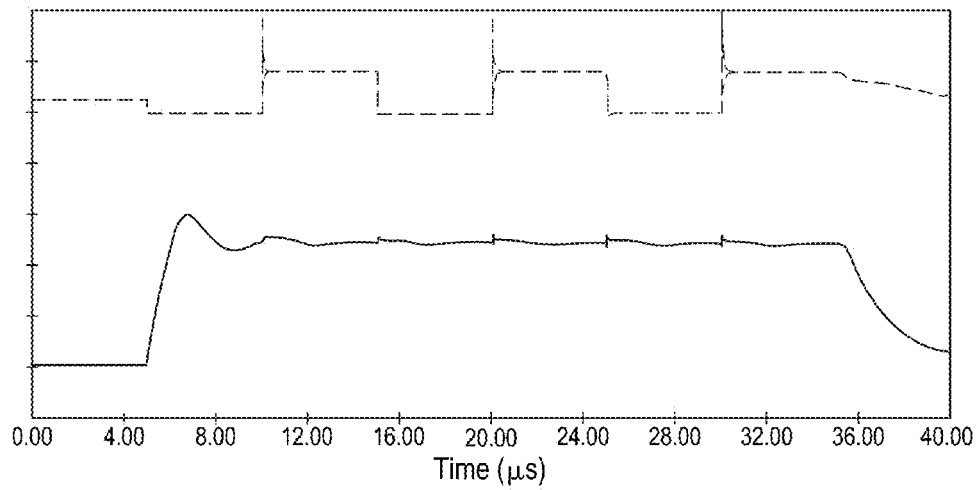
FIG. 11C is an example of an output waveform produced from the pulse generator shown in FIG. 11A compared with the input waveform.

FIG. 11C is an example of an output waveform produced from the pulse generator shown in FIG. 11A compared with the input waveform with the load resistor, $R_L$, replaced with a 1 kOhm resistor. In this example, the output waveform is substantially similar yet with the waveform in FIG. 11B but with a higher overshoot and with more ringing.

Figure 12A:
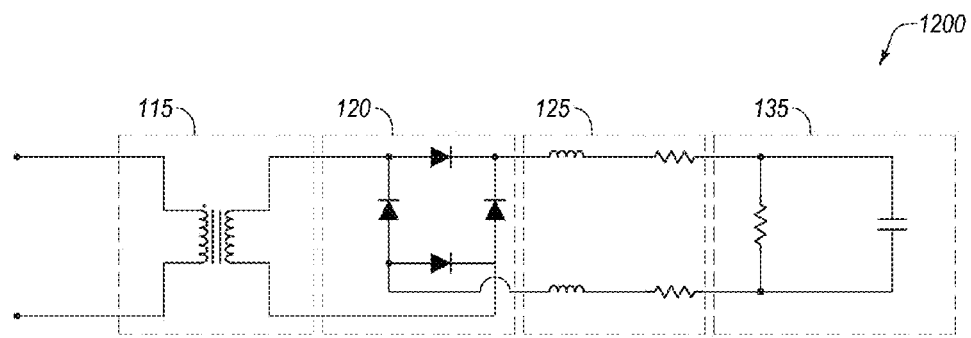
FIG. 12A is an example circuit diagram 1200 of a portion pulse generator according to some embodiments described in this document.

FIG. 12A is an example circuit diagram 1200 of a portion of a pulse generator according to some embodiments described in this document. The circuit diagram 1200 shows a transformer stage 115 that includes a 1:5.5 transformer. The circuit diagram 1200 also shows a rectifier stage 120, a filter stage 125, and an output stage 135. The filter stage 125 in this example includes circuit elements that include a single 125 μH inductor and a single 10 ohm resistor. While this example shows specific circuit elements with specific values, various other elements may be included. The output stage 135 includes a 250 Ohm load with 2 nF capacitance.

Figure 12B:
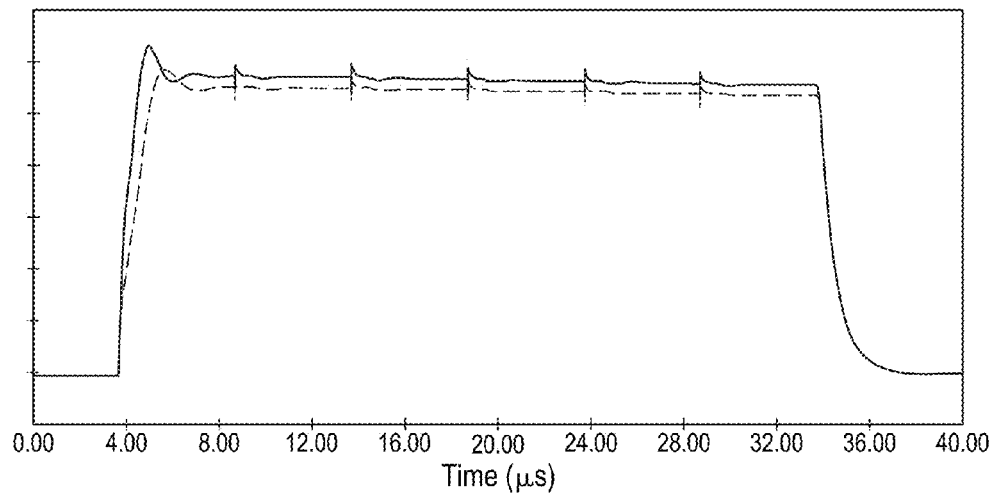
FIG. 12B is an example of an output waveform produced from the pulse generator shown in FIG. 12A compared with the output waveform produced from the pulse generator shown in FIG. 11A.

FIG. 12B is an example of an output waveform produced from the pulse generator shown in FIG. 12A compared with the output waveform produced from the pulse generator shown in FIG. 11A. The removal of one inductor and one resistor can provide for a faster rise time and/or a higher output voltage.

Some embodiments include a pulse generator that produces a square wave with one or more of the following waveform specifications: a frequency range of 0.1 Hz to 10 MHz, a pulse width range of 10 ns to 10 s, a rise time (and/or a fall time) of 1 ns to 100 μs, a duty cycle between 0 and 100%, a flat top ripple range between 0 and 200%, and an output voltage of more than 1 kV, 2 kV, 5 kV, 10 kV, 30 kV, 100 kV, 300 kV, 1,000 kV.

Embodiments described within this document may include a pulse generator that produces an arbitrary and/or variable waveform with one or more of the following waveform specifications: a frequency range of 0.1 Hz to 10 MHz, a pulse width range of 10 ns to 10 s, a rise time and/or a fall time of 1 ns to 100 μs, a duty cycle between 0 and 100%, a dI/dt between 10 A/s to 1,000 kA/μs and an output voltage of more than 1 kV, 2 kV, 5 kV, 10 kV, 30 kV, 100 kV, 300 kV, 1,000 kV.

Embodiments described within this document may include a pulse generator that produces both high frequency pulses (e.g., pulses with a frequency greater than 10 kHz) and low frequency pulses (e.g., pulses with a frequency less than 1 Hz or a DC pulse). Such a pulse generator may also output voltages above 2 kV.

Embodiments described within this document may include a pulse generator that produces a high voltage DC pulse with a rise time of less than 10 μs (or a rise time less than 1 μs), an output voltage greater than 1 kV, and/or a ripple between 2% and 50%.

Figure 13A:
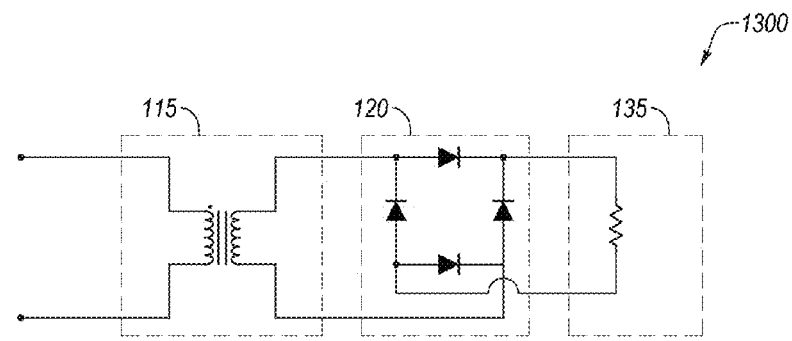
FIG. 13A is an example circuit diagram of a portion of a pulse generator according to some embodiments described in this document.

FIG. 13A is an example circuit diagram 1300 of a portion of a pulse generator according to some embodiments described in this document. The circuit diagram 1300 shows a transformer stage 115 that includes a 1:5.5 transformer. The circuit diagram 1300 also shows a rectifier stage 120 and an output stage 135, but no filter stage 125. The output stage 135 includes a 250 Ohm load.

Figure 13B:
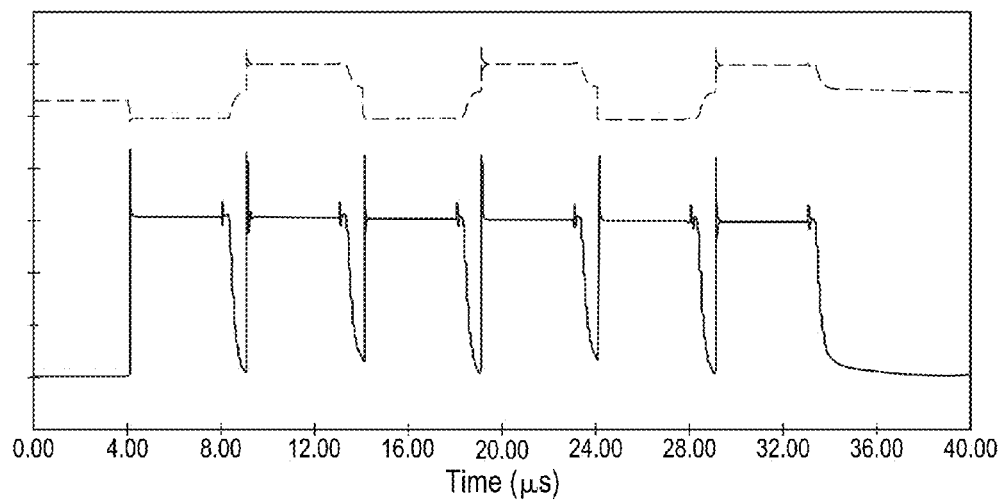
FIG. 13B is an example of an output waveform produced from the pulse generator shown in FIG. 13A.

FIG. 13B is an example of an output waveform compared with the input waveform. A 50 V input square wave (dashed) was provided via $V_{CH}$. As shown, the output waveform (solid) has a very sharp rise time (e.g., about 50 ns) and has a high duty cycle (e.g., about 70%). Various other duty cycles may be used such as, for example, duty cycles of any percentage between 0% and 100%. In some embodiments, the duty cycle may change over time.

Figure 14A:
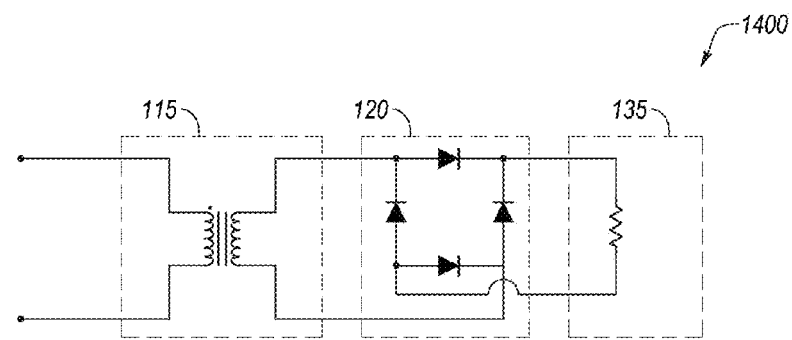
FIG. 14A is an example circuit diagram of a portion of a pulse generator according to some embodiments described in this document.

FIG. 14A is an example circuit diagram 1400 of a portion of a pulse generator according to some embodiments described in this document. The circuit diagram 1400 shows a transformer stage 115 that includes a 1:5.5 transformer. The circuit diagram 1400 also shows a rectifier stage 120 and an output stage 145, but no filter stage 125. The output stage 145 includes a 250 Ohm load.

Figure 14B:
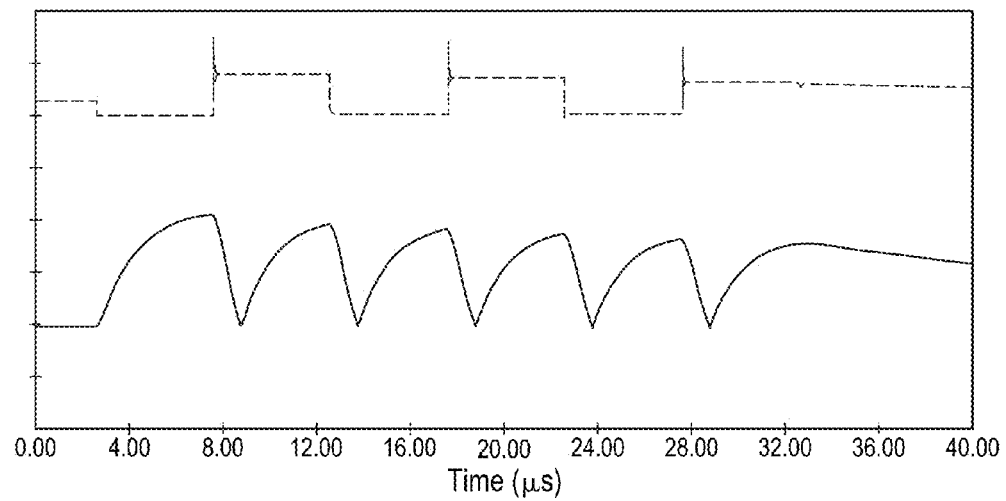
FIG. 14B is an example of an output waveform produced from the pulse generator shown in FIG. 14A.

FIG. 14B is an example of an output triangular wave waveform compared with the square wave input waveform. A 200 V input square wave (dashed) was provided via $V_{CH}$. As shown, the triangular wave output waveform (solid) has a gradual rise time (e.g., about 4 μs) and a gradual fall time, which creates the triangular wave shape. The output waveform has an amplitude of 1,000 volts.

In some embodiments, a pulse generator may produce a plurality of pulses at high frequency (e.g., greater than 2 kHz) and high voltage (e.g., greater than 2 kV) for a period of time, pause for a period of time, and then begin pulsing at another frequency or the same frequency and high voltage for another period of time. The pulse generator may repeat this process over and over again. In some embodiments, the frequency and/or voltage of each set of pulses may vary.

In some embodiments, the various pulse generators described in this document may generate high voltage pulses (greater than 2 kV), with fast rise times (e.g., less than 100 ns) as well as with long and/or variable pulse widths and/or variable duty cycles. Pulse generators often cannot generate pulses that are a combination of fast features (e.g., fast rise times) and slow features (e.g., long pulses). Some embodiments described in this document can combine fast features with slow features.

Figure 15:
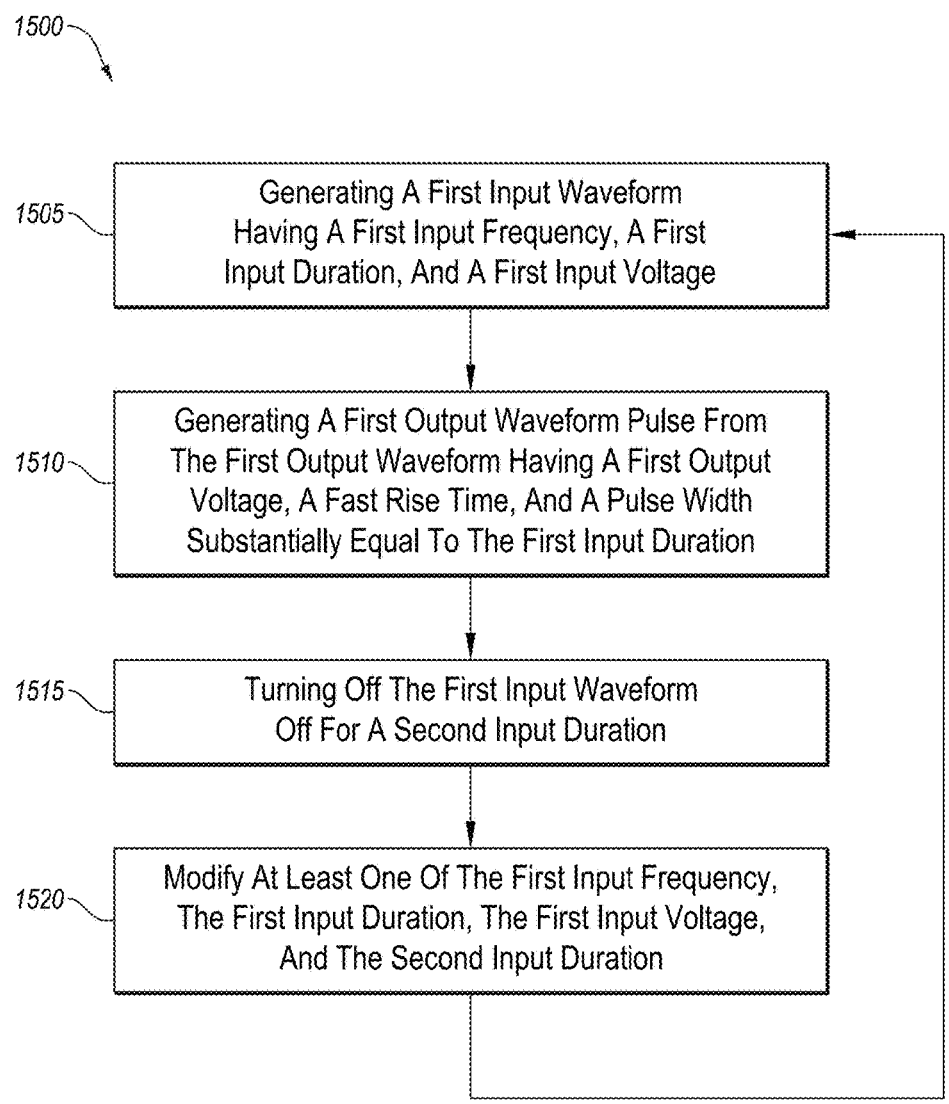
FIG. 15 is a flowchart of a process for producing an arbitrary pulse width output signal according to some embodiments described in this document.

FIG. 15 is a flowchart of a process 1500 for producing an arbitrary pulse width output signal according to some embodiments described in this document. Process 1500 begins at block 1505 where a first input waveform is generated that has a first input frequency, a first input duration, and a first input voltage. In some embodiments, the first input waveform may be generated from the driver stage 105. For example, the first input waveform may have a voltage of 200 volts to 2,000 volts and/or has a frequency greater than 10 kHz. The first duration may include any period of time. In some embodiments, the first duration may be longer than two periods of the first input frequency. In some embodiments, the first duration may be between 10 μs and 10 seconds.

At block 1510 a first output waveform is generated from the first output waveform having at least one of a first output voltage, a fast rise time, and/or a pulse width substantially equal to the first input duration. In some embodiments, the first output voltage may be directly proportional with the first input voltage. In some embodiments, the first output voltage may be greater than 2 kV. In some embodiments, the fast rise time may include a rise time less than about 5 μs or less than about 100 ns. Various other fast rise times and/or output voltages may be used.

At block 1515 the first input waveform may be turned off for a second input duration. The first input waveform may be considered turned off when the waveform produces zero volts or a voltage at a DC bias voltage level. The second input duration, for example, may include any period of time. For example, the second input duration may be longer than the rise time and/or the first input duration. As another example, the second input duration may be less than one period of the first input frequency. The second input duration may include any period of time.

At block 1520, at least one of the first input frequency, the first input duration, the first input voltage, and the second input duration may be modified so a subsequent pulse may have a different output voltage, a different output duration, and/or a different period of time when the pulse produces zero volts or a voltage at a DC bias level.

After block 1520, the process 1500 may be repeated any number of times without limitation. In some embodiments, during at least one cycle of process 1500 none of the first input duration, the first input voltage, and the second input duration may be modified in block 1520.

The fast switching found in the driver stage 105 and the low inductance in various stages of a pulse generator may allow for fast rise times and/or variable pulse widths. Embodiments described within this document may also produce, for example, high voltage pulses with variable duty cycle and/or variable frequency.

In some embodiments, more than one pulse generator may be combined in any combination such as, for example, in serial and/or in parallel. In some embodiments, two pulse generators may be used with opposite polarities and configured substantially identically to create a square wave.

The term "about" shall mean plus or minus 5%.

The term "substantially" shall mean within manufacturing tolerances.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Some portions may be presented in terms of algorithms or symbolic representations of operations on data bits or binary digital signals stored within a computing system memory, such as a computer memory. These algorithmic descriptions or representations are examples of techniques used by those of ordinary skill in the data processing art to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical, electronic, or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art.

That which is claimed:

1. A pulse generator comprising:
    a driver stage comprising at least one of one or more IGBTs and one or more MOSFETs, the driver stage generates a first input waveform;
    a transformer stage coupled with the driver stage, the transformer stage including one or more transformers;
    a rectifier stage coupled with the transformer stage having stray inductance less than 1,000 nH;
    an output stage coupled with the rectifier stage, the output stage having a storage capacitor, the output stage outputting a first output pulse having a rise time less than 1,000 nanoseconds, a first output voltage greater than 2 kilovolts; and
    a sink stage coupled with the output stage, the sink stage comprising a fast switch, wherein energy stored in the storage capacitor is dumped when the fast switch is closed.

2. The pulse generator according to claim 1, wherein the driver stage has a stray inductance less than 300 nH.

3. The pulse generator according to claim 1, wherein the fast switch opens and closes within 1 μs or faster.

4. The pulse generator according to claim 1, wherein the fast switch comprises at least one of one or more IGBTs and one or more MOSFETs.

5. The pulse generator according to claim 1, wherein the fast switch comprises one or more fast switches arranged in parallel and/or arranged in series.

6. The pulse generator according to claim 1, wherein the first input waveform has a voltage less than 1 kV.

7. The pulse generator according to claim 1, wherein a total inductance in the rectifier stage is less than 500 nH.

8. The pulse generator according to claim 1, further comprising a balance stage coupled with the driver stage and the transformer stage that includes one or more blocking capacitors.

9. The pulse generator according to claim 1, wherein the fast switch comprises a plurality of switches.

10. A high voltage pulser comprising:
  a driver stage comprising at least one of one or more IGBTs and one or more MOSFETs, the driver stage generates a first input waveform;
  a transformer stage coupled with the driver stage, the transformer stage including one or more transformers;
  an output stage coupled with the transformer stage, the output stage having a storage capacitor, the output stage outputting a first output pulse, the first output pulse having a rise time less than 1,000 nanoseconds and a first output voltage greater than 2 kilovolts; and
  a sink stage coupled with the output stage, the sink stage comprising a fast switch, wherein energy stored in the storage capacitor is dumped when the fast switch is closed.

11. The high voltage pulser according to claim 10, further comprising a rectifier stage coupled with the transformer stage and the output stage, the rectifier stage having stray inductance less than 1,000 nH.

12. The high voltage pulser according to claim 10, wherein the first output pulse has a rise time less than 1,000 nanoseconds.

13. The high voltage pulser according to claim 10, wherein the output stage outputs a signal with a frequency greater than 50 kHz.

14. The high voltage pulser according to claim 10, wherein the driver stage has a stray inductance less than 500 nH.

15. The high voltage pulser according to claim 10, further comprising a filter stage coupled with the rectifier stage and the output stage, wherein the filter stage comprises an inductor with an inductance of less than 50 nH.

16. The high voltage pulser according to claim 10, further comprising a filter stage coupled with the rectifier stage and the output stage, wherein the filter stage comprises a capacitor with a capacitance of less than 50 nF.

17. The high voltage pulser according to claim 10, wherein a total inductance in the transformer stage is less than 1,000 nH.

18. The high voltage pulser according to claim 1, wherein the fast switch comprises a plurality of switches.

19. A method comprising:
  closing at least a first switch to provide a first input waveform to a transformer, the first switch coupled with a source and disposed on a primary side of the transformer;
  charging a storage capacitor disposed on the secondary side of the transformer with the first input waveform after passing through the transformer;
  opening the first switch after a first duration;
  opening a second switch, the second switch disposed on a secondary side of the transformer;
  outputting a first output pulse having a rise time less than 1,000 nanoseconds and a first output voltage, the first output pulse being provided by energy in the storage capacitor;
  closing the second switch causing energy stored in the storage capacitor to be dumped.

20. The method according to claim 19, further comprising stepping up a voltage of the first input waveform to the voltage of the first output pulse with the first output voltage of greater than 2 kV.

* * * * *